United States Patent [19]
Abt

[11] Patent Number: 4,611,871
[45] Date of Patent: Sep. 16, 1986

[54] SHOCK MOUNT

[75] Inventor: Edgar J. Abt, Tempe, Ariz.

[73] Assignee: Motorola, Inc., Schaumburg, Ill.

[21] Appl. No.: 236,952

[22] Filed: Feb. 23, 1981

[51] Int. Cl.$^4$ .......................................... H01R 33/975
[52] U.S. Cl. ............................... 339/93 C; 174/52 PE
[58] Field of Search ................. 339/93 R, 93 C, 93 L; 174/52 R, 52 PE

[56] References Cited
U.S. PATENT DOCUMENTS 2,894,316 7/1959 Genovese ....................... 174/52 PE
3,239,595 3/1966 Reese et al. .................... 174/52 PE

FOREIGN PATENT DOCUMENTS 242040 12/1962 Australia ........................ 174/52 PE
960094 6/1964 United Kingdom ........... 174/52 PE Primary Examiner—Gil Weidenfeld
Assistant Examiner—Gary F. Paumen
Attorney, Agent, or Firm—Eugene A. Parsons

[57] ABSTRACT

A shock mount comprising a hollow outer sleeve, open at one end, which contains a hollow inner sleeve, likewise open at one end but having longitudinal external grooves which connect with the internal cavity of the inner sleeve near its open end. The inner sleeve contains a shock attenuating medium, a relatively fragile device, to which are connected loop bendable leads, and a spacer for maintaining the relative positions of the components, said spacer being slotted to preserve the looped portion of each lead. Upon application of the shock pulse the container crushes the shock attenuating medium, thereby attenuating the shock pulse, and the looped portion of each lead is drawn through its corresponding slot to follow the container, thereby preserving the signal linkage.

9 Claims, 2 Drawing Figures

SHOCK MOUNT

BACKGROUND OF THE INVENTION

The present invention relates to shock mounts and in particular to shock mounts for tuning fork crystals.

Oscillator stability is an extremely important factor in total fuzing accuracy for time fuzes used in artillery shells. For a 200-second fuze with 0.1-second maximum time error over the operating temperature range, the oscillator must remain within ±0.05 percent of its nominal setting. Crystal oscillators exhibit this sort of high stability.

Therefore it is desirable to use crystal oscillator circuits in projectile fuzes in lieu of less stable, more expensive, and bulkier frequency generators.

Although most common shapes of high frequency crystals can be made gun-rugged, those crystals require exceptional amounts of current for proper operation. For low oscillation frequency capability, a tuning fork type of crystal is often the best choice.

In the past, crystals of the tuning fork variety have been shown not to be reliable in their ability to survive high-g shocks. For such a crystal to be practical for projectile fuze applications, it must be capable of sustaining shock in the 20,000 to 30,000 g range with virtually 100 percent survival. Heretofore an integral shock mount in the crystal assembly was required to perform the entire shock attenuation function.

SUMMARY OF THE INVENTION

Accordingly, it is an object of the present invention to provide a new shock mount for relatively fragile devices including various electronic components not previously considered to be adaptable to high shock pulse environments because of their inherent fragility.

It is a further object of the present invention to provide a shock mount for a tuning fork crystal that employs a non-resilient, shock absorbing medium that crushes under the axial acceleration load within a projectile, thereby attenuating the shock pulse as a function of the deflection characteristic of the absorption medium.

In order to attain the aforementioned objects, the present invention comprises a hollow outer sleeve open at one end within which fits a hollow inner sleeve, likewise open at one end but having longitudinal external grooves which connect with the internal cavity of the inner sleeve near its open end. Within the inner sleeve are contained, in order of increasing distance from the closed end of the inner sleeve: a shock attenuating medium, a relatively fragile device having connected bendable leads, each of which forms a loop before running within the grooves on the external surface of the inner sleeve, and a spacer for maintaining the relative positions of the components, the spacer being slotted to preserve the looped portion of each lead. The inner sleeve is slipped within the outer sleeve so that the free ends of the leads are exposed. Upon application of the shock pulse, the container crushes the shock attenuating medium, thereby attenuating the shock pulse, and the looped portion of each lead is drawn through its corresponding slot to follow the container.

DESCRIPTION OF THE DRAWINGS

Referring to the drawings wherein like numerals indicate like structures.

DESCRIPTION OF THE PREFERRED EMBODIMENT

Figure 1:
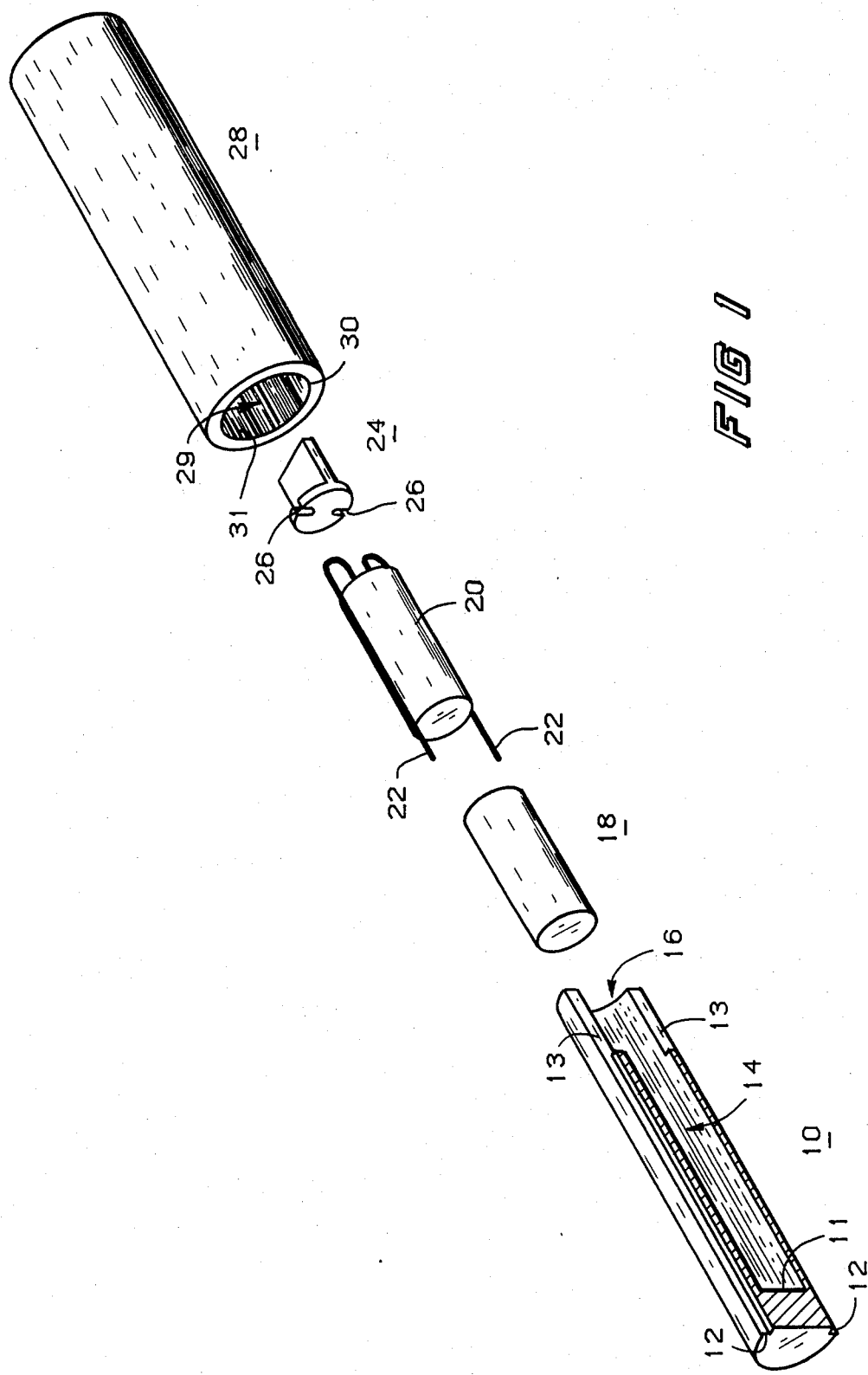
FIG. 1 is an exploded view of a preferred embodiment of the present invention, including a sectional view of the inner sleeve.

Referring specifically to FIG. 1, an exploded view of a preferred embodiment of the present invention is illustrated. Inner sleeve 10 is shown in longitudinal section to reveal an internal cavity 14 which has an external opening 16 and internal surface 11. Longitudinal grooves 12 run from the closed end of the inner sleeve to a point near opening 16 where they connect with internal cavity 14 by way of connecting spaces 13. Shock attenuating medium 18 is shaped to fit within cavity 14. Tuning fork crystal assembly 20 is also shaped to fit within cavity 14, but it is coupled with external leads 22, which bend back from one end of assembly 20 to run longitudinally along assembly 20 and extend beyond the other end of assembly 20. Spacer 24 has slots 26. Outer sleeve 28 surrounds an internal cavity 29 which has an external opening 30 and internal surface 31. One skilled in the art understands that although both an outer and an inner sleeve are shown in the embodiment of FIG. 1, a single protective structure can be used where design constraints permit its use.

The embodiment of the present invention as shown in FIG. 1 is assembled by sequentially inserting shock attenuating medium 18 within cavity 14 of inner sleeve 10 so that it rests against surface 11. Component assembly 20 is inserted in cavity 14 of inner sleeve 10 so that leads 22 pass within grooves 12 and extend out beyond the closed end of inner sleeve 10. Spacer 24 is then inserted within cavity 14 of inner sleeve 10 so that the bent portions of leads 22 of assembly 20 pass through slots 26 of spacer 24 and the assembly is completed by inserting the inner sleeve 10 and its contents through opening 30 and into cavity 29 of outer sleeve 28.

Figure 2:
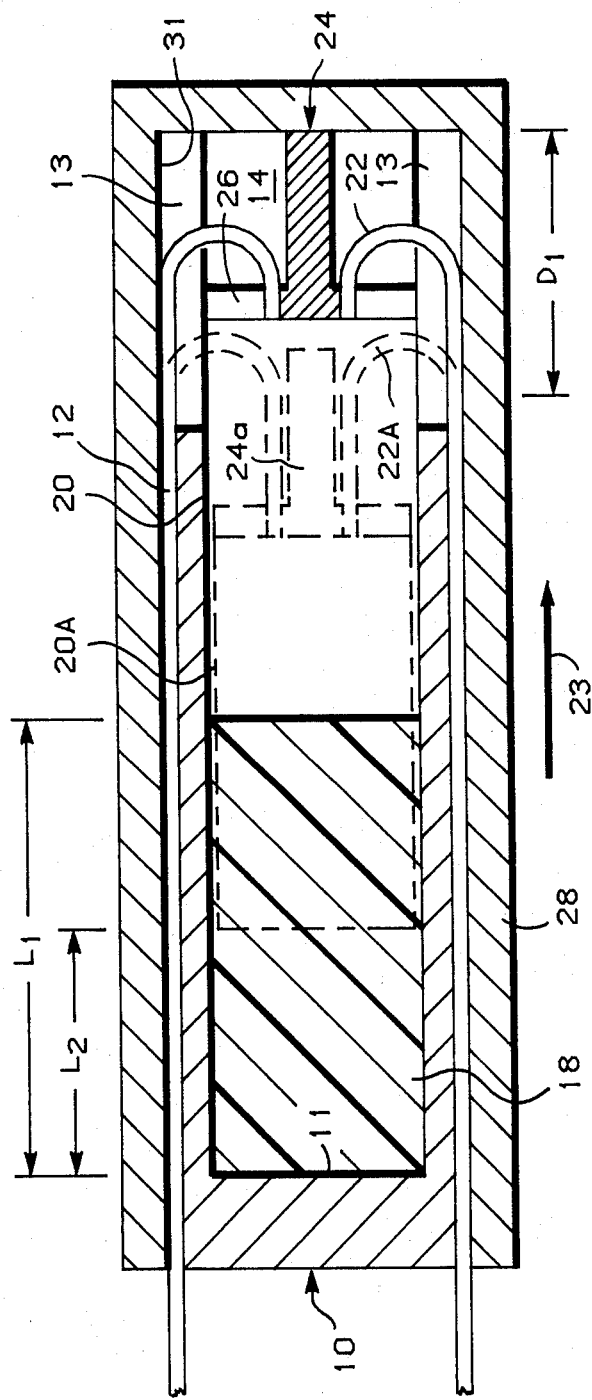
FIG. 2 is a sectional view along the long axis of the embodiment of the present invention as shown in FIG. 1, showing positions of elements before (as indicated by the absence of a suffix) and after (as indicated by the presence of the suffix "A") a shock pulse is applied.

The solid-lined portions of FIG. 2 illustrate the embodiment of FIG. 1 as assembled. It can be seen in FIG. 2 that spacer 24 preserves and protects the configuration of the bent portion of leads 22. It can also be seen that the juxtaposition of grooves 12 and internal surface 31 form a closed channel from cavity 14 to the exterior of outer sleeve 28.

The embodiment as shown in FIG. 2 is oriented within a projectile so that the set back shock pulse is applied in the direction of flight 23 which lies parallel to the major axis of the device in FIG. 2. Such a shock pulse causes assembly 20 to move from its position at a distance L1 from the closed end of the inner sleeve to a distance L2 from the closed end of the inner sleeve, resulting in a permanent deformation of shock absorbing medium 18 as shown in FIG. 2. Maximization of the ratio $L_1/L_2$ in the preferred embodiment maximizes the shock attenuating properties of a given size package.

In the preferred embodiment a closed cell foam such as a rigid polyurethane foam having a density of five pounds per cubic foot is used as the attenuating medium, but it is understood, by one skilled in the art, that any material could be employed which crushes under the axial acceleration load or otherwise attenuates the effect of the shock pulse through non-resilient compression sufficient to protect fragile electronic component 20.

As can also be seen in FIG. 2, application of a shock pulse causes one end of leads 22 to be pulled through connecting spaces 13 toward closed end 11 of inner sleeve 10. The bent portions of leads 22 thus provide slack which is taken up in order to preserve the external signal linkage during and after movement of assembly 20. It will be understood by one skilled in the art that the length $D_1$ of connecting spaces 13 must be sufficient to permit leads 22 to follow fragile component assembly 20 as it moves from position L1 to position L2. Furthermore, although electrically conductive wire leads are employed in the preferred embodiment, it would be obvious to one skilled in the art to employ other signal linkage means, such as fiber-optic cables, where it is advantageous to do so.

The illustrated embodiment of the present invention is used in a projectile by orienting the mount within the projectile so that acceleration of the projectile urges assembly 20 toward surface 11.

While I have shown and described a specific embodiment of this invention, further modifications and improvements will occur to those skilled in the art. I desire it to be understood, therefore, that this invention is not limited to the particular form shown and that I intend in the appended claims to cover all modifications which do not depart from the spirit and scope of this invention.

I claim:

1. A mount for protecting a relatively fragile device during application of a shock pulse, comprising in combination:
   protective means for enclosing the fragile device, said protective means having an internal cavity with at least one internal surface portion, the fragile device being located within said internal cavity;
   non-resilient compressible means for attenuating the shock pulse, said means for attenuating being selected to be non-resilient and compressible relative to the fragile device said non-resilient means being located within said internal cavity between the fragile device and said internal surface portion, said internal surface portion being oriented with respect to the fragile device such that the application of the shock pulse on the fragile device urges the fragile device toward said internal surface portion whereby said nonresilient means is crushed from an initial volume to a crushed volume by said fragile device to attenuate the effect of the shock pulse on the fragile device; and
   bendable means for providing slack in an external signal linkage, said bendable means being coupled to the fragile device, said bendable means having at least one looped portion.

2. The mount as recited in claim 1 wherein said protective means comprises:
   an outer sleeve having at least one internal surface portion, said outer sleeve being closed at one end, an inner sleeve, said inner sleeve being closed at one end, said inner sleeve having an external surface said inner sleeve being inserted within said outer sleeve, and said inner sleeve having at least one groove running along said external surface of said inner sleeve, said groove connecting with said internal cavity and said at least one groove being positioned so that a juxtaposition of said internal surface portion of said outer sleeve and said at least one groove forms at least one channel running from within said internal cavity to without said internal cavity; and
   wherein said bendable means comprises at least one wire lead, one end of said at least one lead being coupled to the fragile device, a portion of said wire lead proximal to said one end being bent to form a loop, and a portion of said wire lead distal to said one end passing within said groove without said protective means.

3. The mount as recited in claim 1 or 2 wherein said non-resilient means comprises a closed cell foam.

4. A mount for protecting a relatively fragile device during application of a shock pulse, comprising in combination:
   protective means for enclosing the fragile device, said protective means having an internal cavity with at least one internal surface portion, the fragile device being located within said internal cavity;
   non-resilient compressible means for attenuating the shock pulse, said means for attenuating being selected to be non-resilient and compressible relative to the fragile device, said non-resilient means being located within said internal cavity between the fragile device and said internal surface portion, said internal surface portion being oriented with respect to the fragile device such that the application of the shock pulse on the fragile device urges the fragile device toward said internal surface portion whereby said non-resilient means is crushed from an initial volume to a crushed volume by said fragile device to attenuate the effect of the shock pulse on the fragile device;
   bendable means for providing slack in an external signal linkage, said bendable means being coupled to the fragile device, said bendable means having at least one looped portion; and
   means for controlling the location of the fragile device such that said looped portion of said bendable means is preserved.

5. The mount as recited in claim 4 wherein said protective means comprises:
   an outer sleeve having at least one internal surface portion, said outer sleeve being closed at one end, an inner sleeve, said inner sleeve being closed at one end, said inner sleeve having an external surface said inner sleeve being inserted within said outer sleeve, and said inner sleeve having at least one groove running along said external surface of said inner sleeve, said groove connecting with said internal cavity and said groove being positioned so that said internal surface portion of said outer sleeve and said at least one groove forms at least one channel running from within said internal cavity to without said internal cavity;
   wherein said bendable linkage means comprises at least one wire lead, one end of said lead being coupled to the relatively fragile device, a portion of said wire lead proximal to said one end being bent to form a loop, and a portion of said wire lead distal to said one end passing within said groove from within said protective means to without said protective means; and
   wherein said location controlling means comprises a spacer, said spacer having at least one slot fitting around said bent portion of said wire lead, said slot having a major dimension greater than a major dimension of said wire lead.

6. The mount as recited in claim 4 or claim 5 wherein said non-resilient means comprises a closed cell foam.

7. A method for protecting a relatively fragile device during application of a shock pulse comprising the steps of:
provic protective means for enclosing the fragile device, said protective means having an internal cavity with at least one internal surface portion;
employing non-resilient means for attenuating a shock, said non-resilient means being located within said internal cavity;
making ready bendable means for providing slack in an external signal linkage, said bendable means having at least one looped portion, said bendable means being coupled to the fragile device; and
assembling a shock mount by first introducing said crushable means into said cavity and second inserting the fragile device into said internal cavity so that said shock attenuating means lies between the fragile device and said surface portion and so that slack is preserved in said bendable means.

8. The method as recited in claim 7 further comprising the steps of:
producing means for controlling the position of the fragile device such that the configuration of the looped portion of said bendable means is preserved until application of the shock pulse; and
introducing said position controlling means into said internal cavity so that the fragile device is free to move only by compressing said non-resilient means.

9. The method as recited in claim 7 or claim 8 wherein said providing step comprises the steps of:
manufacturing an outer sleeve having an internal cavity, said internal cavity of said outer sleeve having at least one internal surface portion;
fabricating an inner sleeve, said inner sleeve having a closed end, said inner sleeve having an internal cavity, and said inner sleeve having at least one groove running along the external surface of said inner sleeve, said groove connecting with said internal cavity of said inner sleeve; and
inserting said inner sleeve into said outer sleeve so that the juxtaposition of said groove and said internal surface portion of said internal cavity of said outer sleeve forms at least one channel running from internal cavity of said inner sleeve to without said protective means.

* * * * *